(12) United States Patent
Kim

(10) Patent No.: US 9,237,629 B2
(45) Date of Patent: Jan. 12, 2016

(54) ORGANIC EL DISPLAY PANEL FOR REDUCING RESISTANCE OF ELECTRODE LINES

(75) Inventor: Chang Nam Kim, Seoul (KR)

(73) Assignee: MICRON TECHNOLOGY LICENSING, LLC, Redmond, WA (US)

( * ) Notice: Subject to any disclaimer, the term of this patent is extended or adjusted under 35 U.S.C. 154(b) by 396 days.

(21) Appl. No.: 11/703,251

(22) Filed: Feb. 7, 2007

(65) Prior Publication Data
US 2007/0138944 A1    Jun. 21, 2007

Related U.S. Application Data

(63) Continuation of application No. 10/654,896, filed on Sep. 5, 2003, now Pat. No. 7,211,947.

(30) Foreign Application Priority Data

Sep. 5, 2002  (KR) .......................... 10-2002-053562

(51) Int. Cl.
| | |
|---|---|
| *H05B 33/22* | (2006.01) |
| *H05B 33/26* | (2006.01) |
| *H05B 33/10* | (2006.01) |
| *H01L 51/52* | (2006.01) |
| *H01L 27/32* | (2006.01) |

(52) U.S. Cl.
CPC ............ *H05B 33/10* (2013.01); *H01L 51/5206* (2013.01); *H01L 51/5221* (2013.01); *H05B 33/26* (2013.01); *H01L 27/3211* (2013.01); *H01L 27/3281* (2013.01)

(58) Field of Classification Search
CPC ...... H05B 33/22; H05B 33/145; H05B 33/28; H05B 33/06; H01L 27/3246; H01L 51/5203; H01L 27/3281; H01L 51/5284; H01L 27/3283; H01L 27/3295; F21Y 2105/001
USPC .................................................. 313/498–512
See application file for complete search history.

(56) References Cited

U.S. PATENT DOCUMENTS

| | | | |
|---|---|---|---|
| 4,266,223 | A | 5/1981 | Frame |
| 4,720,432 | A | 1/1988 | VanSlyke et al. |
| 5,962,970 | A * | 10/1999 | Yokoi et al. .................... 313/506 |

(Continued)

FOREIGN PATENT DOCUMENTS

| | | |
|---|---|---|
| EP | 0 966 182 A1 | 12/1999 |
| EP | 1 022 931 A1 | 7/2000 |

(Continued)

OTHER PUBLICATIONS

U.S. Office Action dated Dec. 22, 2010 for related U.S. Appl. No. 12/362,138, filed Jan. 29, 2009.

(Continued)

*Primary Examiner* — Anh Mai
*Assistant Examiner* — Nathaniel Lee
(74) *Attorney, Agent, or Firm* — Jeremy Snodgrass; Judy Yee; Micky Minhas

(57) ABSTRACT

An organic EL display comprising a substrate having an EL region, an anode on the EL region of the substrate, a supplementary electrode coupled to a portion of the anode, an organic EL layer on the EL region, and a cathode on the organic EL layer. The supplementary electrode is located at the EL region.

10 Claims, 11 Drawing Sheets

(56) References Cited

U.S. PATENT DOCUMENTS

| | | | |
|---|---|---|---|
| 6,069,443 A * | 5/2000 | Jones et al. ........... 313/504 |
| 6,107,735 A | 8/2000 | Hora | |
| 6,133,581 A * | 10/2000 | Terao et al. ........... 257/40 |
| 6,525,467 B1 | 2/2003 | Eida et al. | |
| 6,626,721 B1 * | 9/2003 | Van Slyke ........... 445/24 |
| 6,876,007 B2 | 4/2005 | Yamazaki et al. | |
| 2002/0014837 A1 * | 2/2002 | Kim et al. ........... 313/505 |
| 2002/0041150 A1 * | 4/2002 | Kim ........... 313/504 |
| 2002/0043932 A1 | 4/2002 | Kawashima | |
| 2002/0057053 A1 * | 5/2002 | Hitoshi ........... 313/505 |
| 2003/0085403 A1 * | 5/2003 | Nagayama et al. ........... 257/72 |

FOREIGN PATENT DOCUMENTS

| | | | |
|---|---|---|---|
| EP | 1 168 448 A2 | 1/2002 |
| EP | 1168448 | 1/2002 |
| EP | 1168448 A2 * | 1/2002 |
| EP | 1 191 593 A2 | 3/2002 |
| EP | 1191593 A2 | 3/2002 |
| EP | 1 195 814 A2 | 4/2002 |
| JP | 4006795 | 1/1992 |
| JP | 05-275172 | 10/1993 |
| JP | 11339970 | 12/1999 |
| JP | 2000036391 | 2/2000 |
| JP | 2000-331783 | 11/2000 |
| JP | 2001185363 | 7/2001 |
| WO | WO 0163975 | 8/2001 |

OTHER PUBLICATIONS

U.S. Office Action dated Jun. 8, 2011 for related U.S. Appl. No. 12/362,138, filed Jan. 29, 2009.

U.S. Office Action dated Mar. 26, 2012 for related U.S. Appl. No. 12/362,138.

Office Action for U.S. Appl. No. 12/362,138 dated Oct. 22, 2012.

* cited by examiner

ORGANIC EL DISPLAY PANEL FOR REDUCING RESISTANCE OF ELECTRODE LINES

This application is a Continuation application of Ser. No. 10/654,896, filed Sep. 5, 2003. The disclosures of the previous application are incorporated by reference herein.

BACKGROUND

1. Field

The present invention relates to display panels, and more particularly, to an organic EL display panel, and a method for fabricating the same.

2. Background

As a size of display becomes larger, demands on flat displays that occupies smaller spaces is increasing. As one of the flat displays, the organic EL display is paid attention. The organic EL display panel has advantages in that a thickness is thin, a matrix form of addressing is available, and a driving voltage is as low as below 15V.

There are a variety of full-color display methods in fabrication of the organic EL display panel, one of which that has the best luminance efficiency is a method employing a shadow mask. FIG. 1 illustrates a section showing a related art method for fabricating an organic EL display panel, and FIG. 2 illustrates a plan view of a shadow mask employed in FIG. 1.

Referring to FIGS. 1 and 2, in the related art method for fabricating an organic EL display panel, a transparent first electrode 2 is formed on a transparent substrate 1, a barrier (not shown) is formed thereon, and red, green, blue organic EL layer 3-1, 3-2, and 3-3 are formed in succession with a shadow mask 4 as shown in FIG. 2.

Then, second electrode material is deposited on an entire surface to form a second electrode in an EL region, thereby fabricating a full color organic EL display panel. The first electrode is an anode and a second electrode is a cathode.

However, the organic EL display panel fabricated thus has waste of power, and a consequential poor efficiency, caused by a resistance of the second electrode (cathode).

In order to overcome such a poor efficiency, though it is required that the second electrode line has a thickness greater than a certain value, it is difficult to fabricate a thickness greater than the certain value by the foregoing method.

DETAILED DESCRIPTION

Accordingly, the present invention is directed to an organic EL display panel, and a method for fabricating the same that substantially obviates one or more of the problems due to limitations and disadvantages of the related art.

An object of the present invention is to provide an organic EL display panel, and a method for fabricating the same, which can reduce resistances of electrode lines, to improve efficiency.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the organic EL display panel having an EL region at a cross of each of first and second electrodes, includes an electric insulating barrier formed between adjacent second electrodes for electrical insulation of the second electrodes, and a supplementary electrode around each of the EL regions, the supplementary electrode being electrically connected to one of the second electrodes.

The second electrode and the supplementary electrode are electrically connected in the vicinity of an edge of the EL region.

The supplementary electrode is formed of a material selected from Cr, Al, Au, W, Cu, Ni, and Ag.

In another aspect of the present invention, there is provided an organic EL display panel including a substrate, first electrodes on the substrate, first supplementary electrodes electrically connected to sides of the first electrodes respectively, second electrodes perpendicular to the first electrodes, an organic EL layer at every cross of the first and second electrodes, second supplementary electrodes electrically connected to the second electrodes around the EL layers respectively, and an electric insulating barrier between adjacent second electrodes for electric insulation of the second electrodes.

In further aspect of the present invention, there is provided a method for fabricating an organic EL display panel having an EL region at every cross of first and second electrodes, including the steps of forming a plurality of first electrodes at regular intervals on a transparent substrate, forming an insulating layer in regions other than the EL regions, forming second supplementary electrodes on the insulating layer, forming an electric insulating barrier between adjacent EL regions perpendicular to the first electrodes, forming an organic EL layer in each of the EL regions with a shadow mask, depositing an electrode material on an entire surface inclusive of the organic EL layer, to form a plurality of second electrodes electrically connected to the second supplementary electrodes, and forming a protection film on an entire surface inclusive of the second electrodes.

The step of forming a plurality of first electrodes further includes the step of forming first supplementary electrodes electrically connected to sides of the first electrodes.

The second supplementary electrodes includes projected parts in the vicinity of edges of the EL regions so as to be in contact with the second electrodes, respectively.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. FIGS. 3A~3G illustrate perspective views each showing the steps of a method for fabricating an organic EL display panel in accordance with a preferred embodiment of the present invention, and FIGS. 4A~4G illustrate plan views each showing the steps of a method for fabricating an organic EL display panel in accordance with a preferred embodiment of the present invention.

Figure 1:
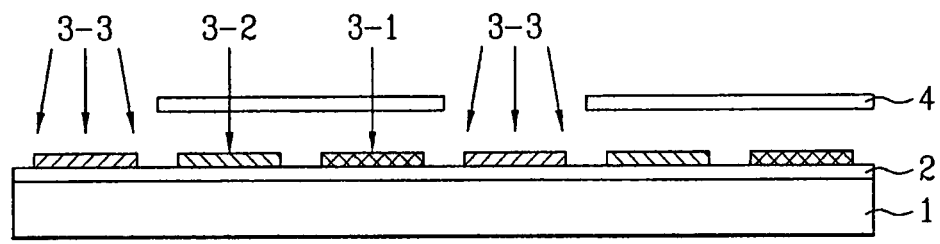
FIG. 1 illustrates a section showing a related art method for fabricating an organic EL display panel.
Figure 2:
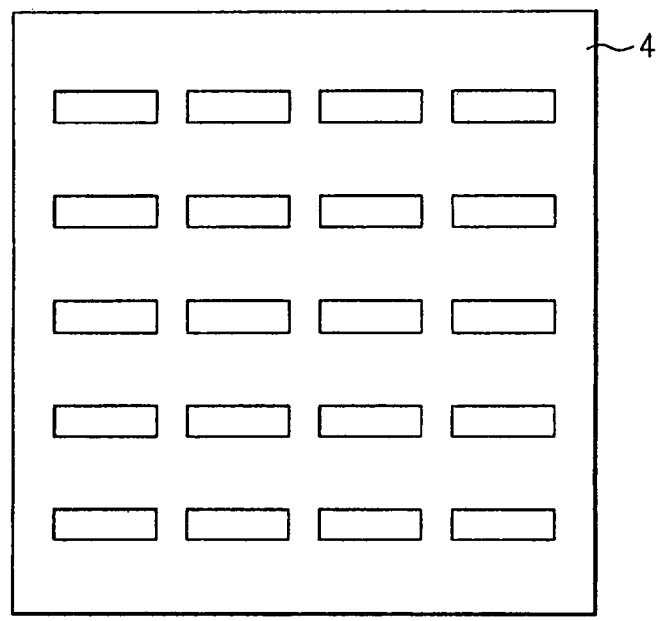
FIG. 2 illustrates a plan view of a shadow mask employed in FIG. 1.
Figure 3A:
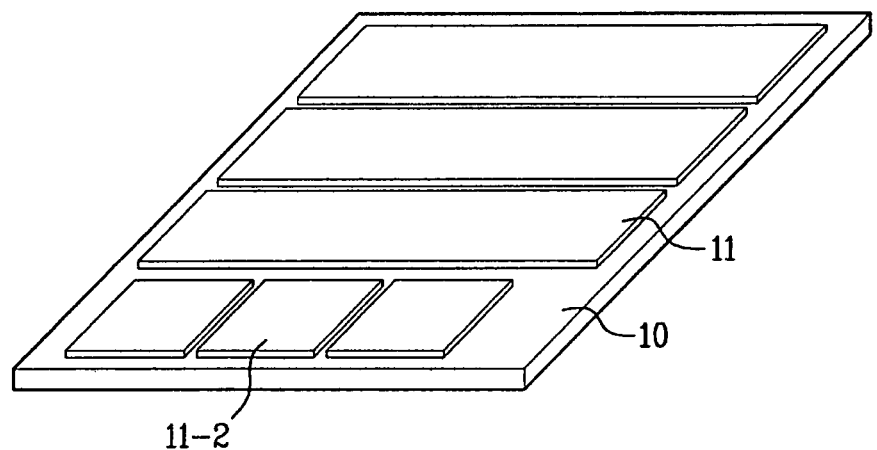
FIGS. 3A~3G illustrate perspective views each showing the steps of a method for fabricating an organic EL display panel in accordance with a preferred embodiment of the present invention.
Figure 4A:
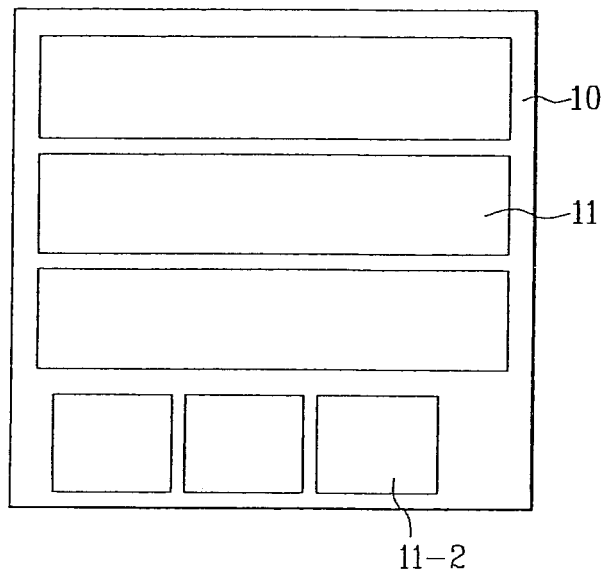
FIGS. 4A~4G illustrate plan views each showing the steps of a method for fabricating an organic EL display panel in accordance with a preferred embodiment of the present invention.

Referring to FIGS. 3A and 4A, first electrodes 11 and pads 11-2 of second electrodes are formed of transparent material on a transparent substrate 10.

Figure 3B:
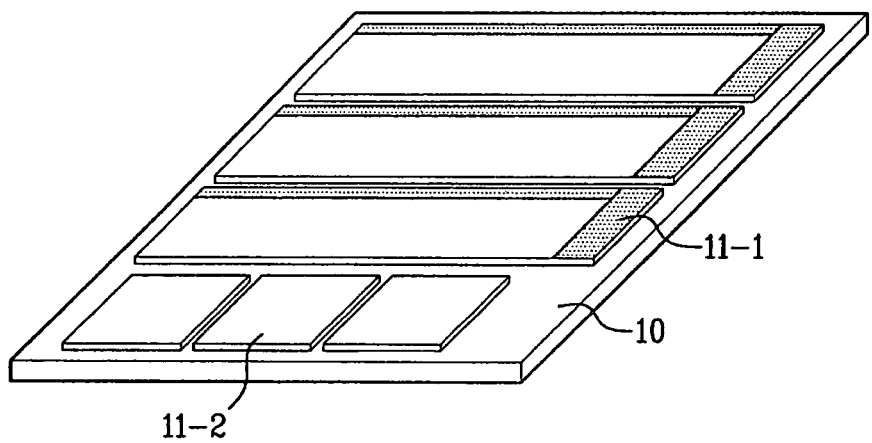
Figure 4B:
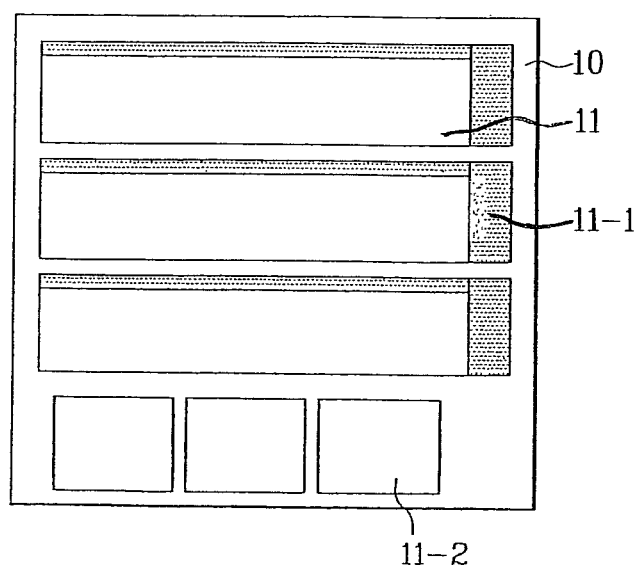

Then, referring to FIGS. 3B and 4B, for reducing resistance of the first electrodes 11, a first supplementary electrode 11-1 is formed such that a part of the first supplementary electrode 11-1 is overlapped with an edge of each of the first electrodes 11. The first supplementary electrode 11-1 is formed of a metal that has a resistance relatively lower than ITO of the first electrode 11, such as Cr, Al, Cu, W, Au, Ni, and Ag.

Figure 3C:
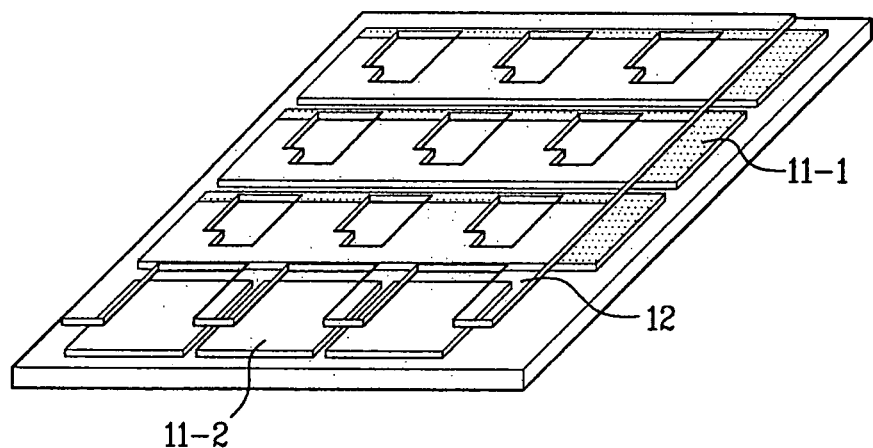
Figure 4C:
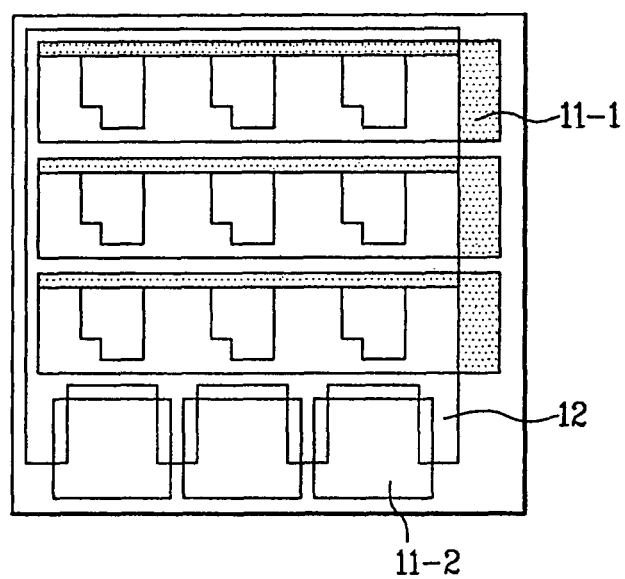

Referring to FIGS. 3C and 4C, an insulating layer 12 is formed in region except an EL region. The insulating layer 12 may be formed of any organic or inorganic material, as far as the material is insulator.

Figure 3D:
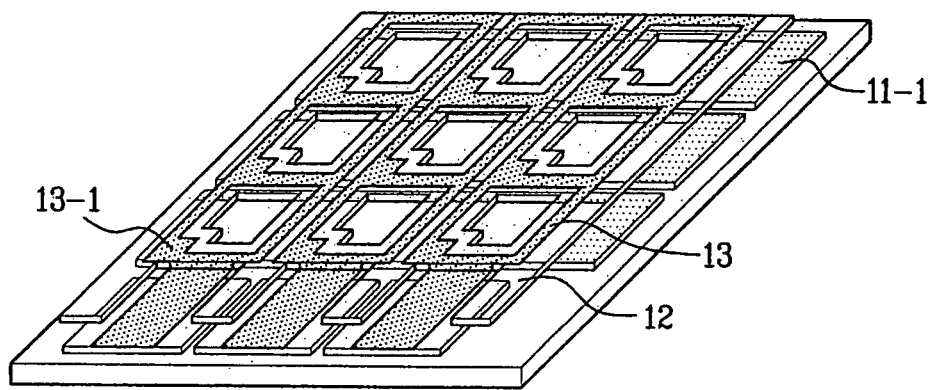
Figure 4D:
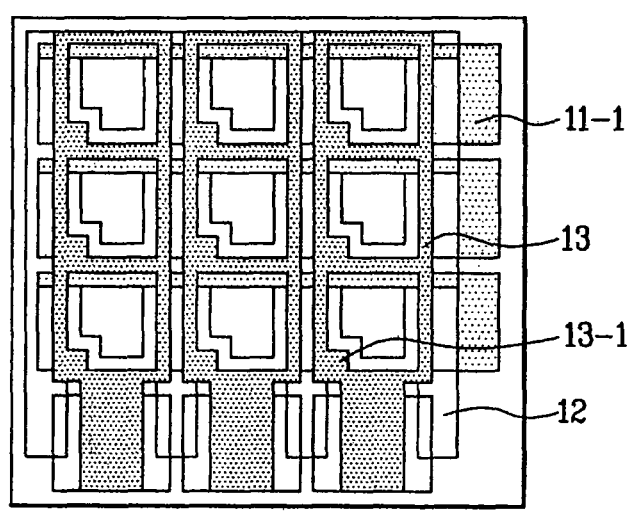

Referring to FIGS. 3D and 4D, a second supplementary electrodes 13 are formed on the insulating layer 12. Each of the second supplementary electrodes 13 has a projected part 13-1 in the vicinity of the edge of the EL region so as to be in contact with each of the second electrodes, electrically. The second supplementary electrode 13 to be in contact with each of the second electrodes is formed of a metal having a resistance lower than the second electrodes relatively, such as Cr, Al, Cu, W, Au, Ni, and Ag.

Figure 3E:
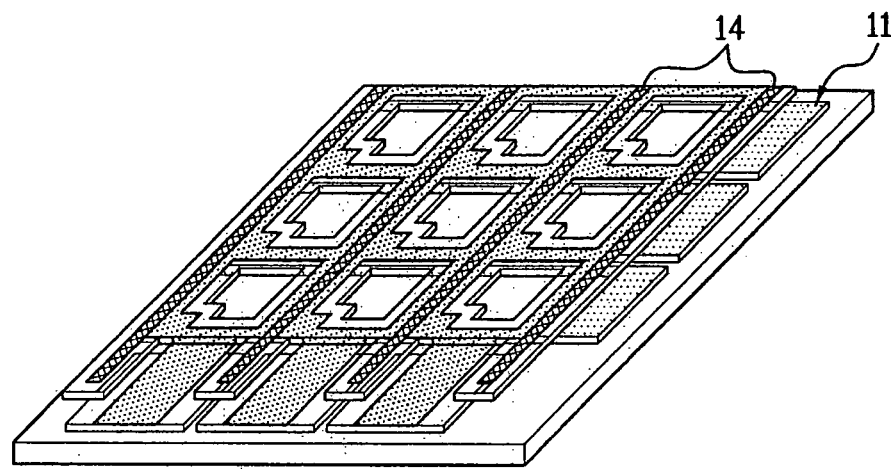
Figure 4E:
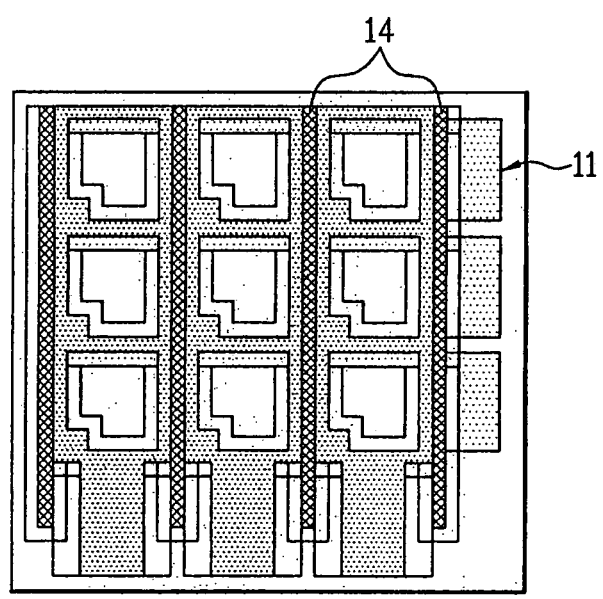

Referring to FIGS. 3E and 4E, a buffer layer (not shown) is formed between adjacent EL regions in a direction perpendicular to the first electrode 11, and an electric insulating barrier on each of the buffer layers.

Figure 3F:
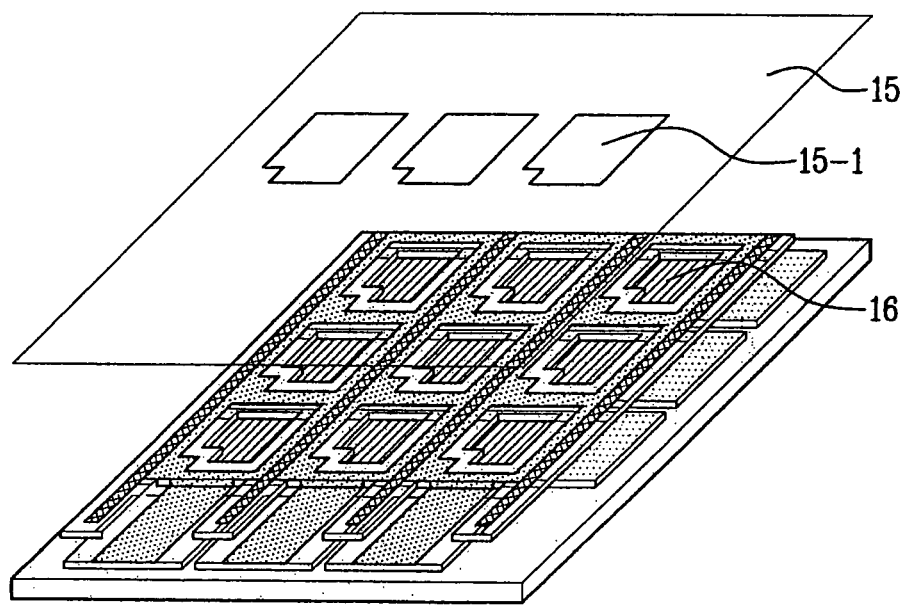
Figure 4F:
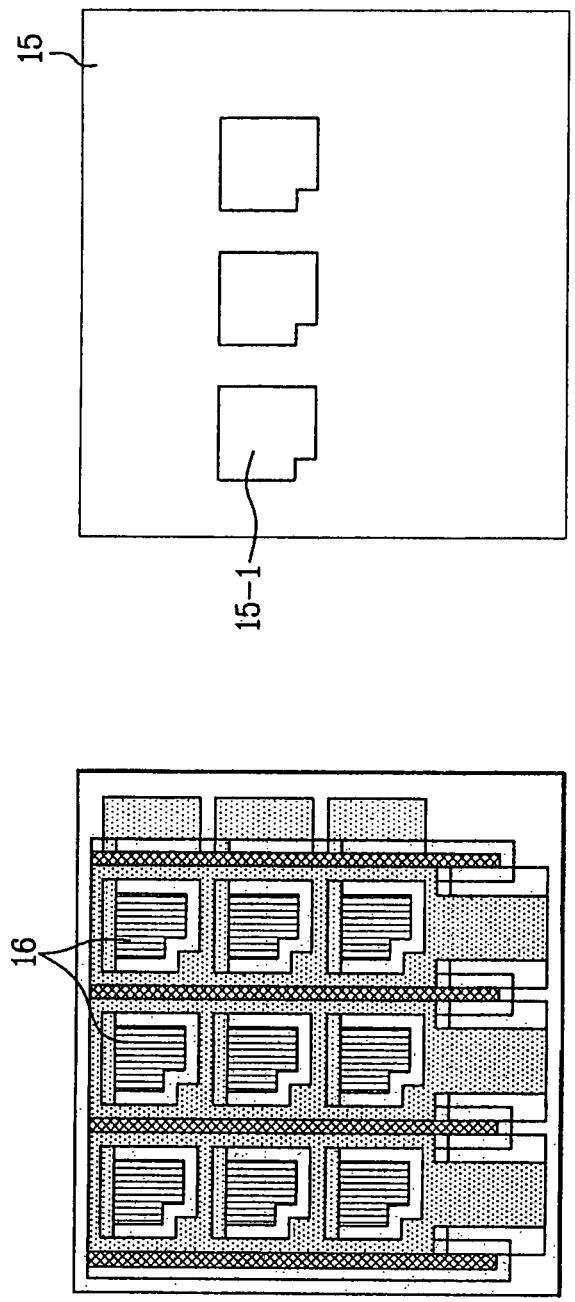

Referring to FIGS. 3F and 4F, an organic EL layer 16 is formed in each of the EL regions with a shadow mask 15 having a plurality of via holes 15-1. The via holes 15-1 in the shadow mask 15 are in conformity with the EL regions.

Figure 3G:
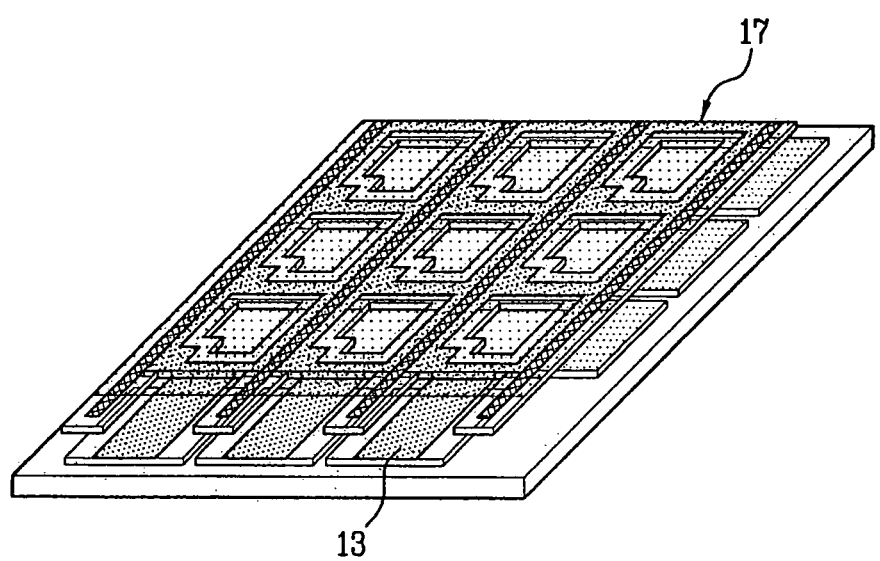
Figure 4G:
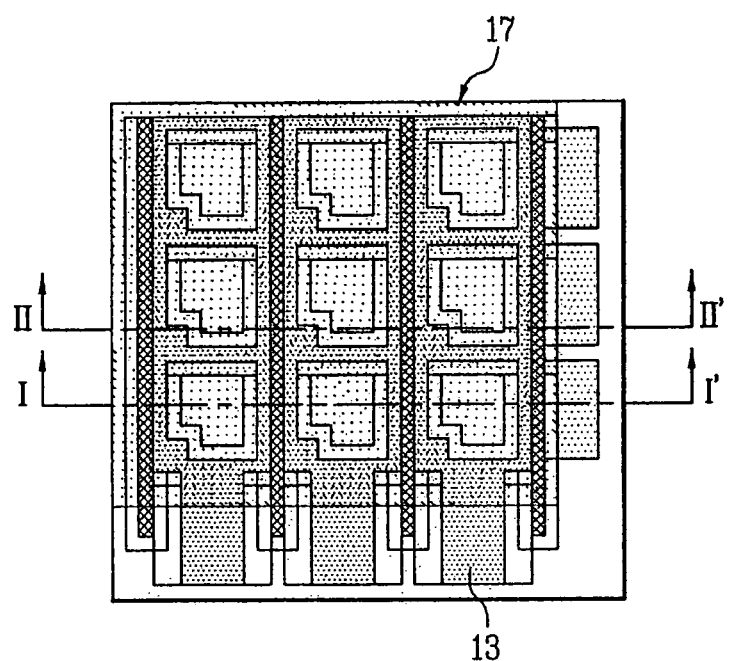

Then, referring to FIGS. 3G and 4G, an electrode material is deposited on an entire surface inclusive of the organic EL layer, to form a plurality of second electrodes 17 electrically connected to the second supplementary electrodes 13, respectively.

Though not shown, a protection film is formed on an entire surface inclusive of the second electrode 17, and an encapsulation is carried out, to finish fabrication of the organic EL display panel. The first electrode is an anode and the second electrode is cathode.

Figure 5A:
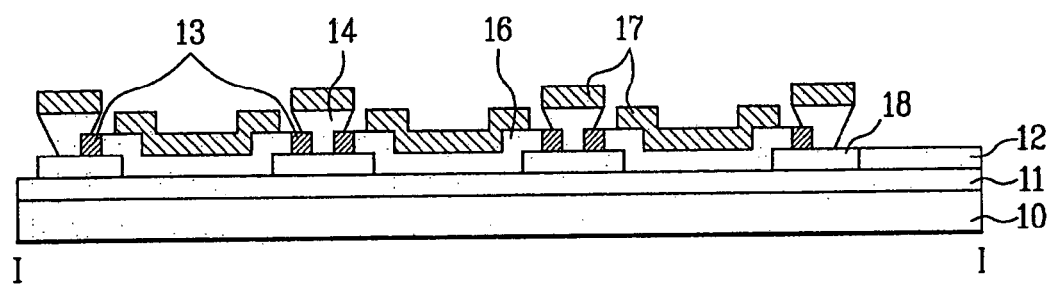
FIG. 5A illustrates a section across a line I-I in FIG. 4G.
Figure 5B:
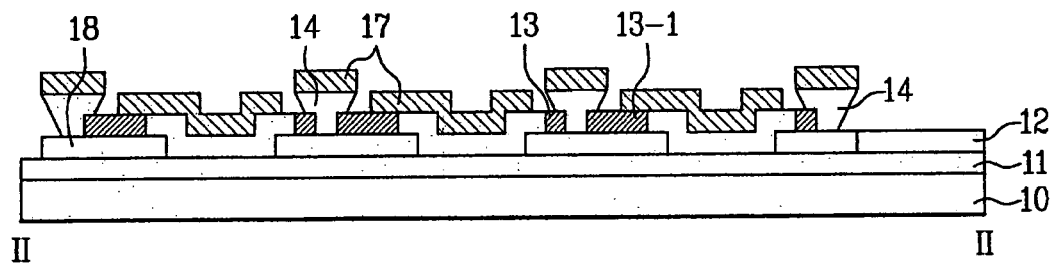
FIG. 5B illustrates a section across a line II-II in FIG. 4G.

FIG. 5A illustrates a section across a line I-I in FIG. 4G, and FIG. 5B illustrates a section across a line II-II in FIG. 4G.

Referring to FIGS. 5A and 5B, the organic EL display panel of the present invention has an EL region at every cross of the first electrodes 11 and the second electrodes 17.

Moreover, the electric insulating barrier 14, formed on each of the buffer layers 18 between adjacent EL regions, insulates the second electrodes 17 from each other, electrically.

Furthermore, the second supplementary electrode 13, formed around each of the EL regions, is connected to each of the second electrodes 17, electrically. Each of the second electrodes 17 is connected to one of the projected parts 13-1 of the second supplementary electrodes 13.

Thus, since the second supplementary electrode can reduce a resistance of the second electrode (cathode), an efficiency of the organic EL display can be improved, and a power required for operating the organic EL display can be reduced, to reduce waste of power.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic EL display comprising:
   a substrate having an EL region;
   an anode on the EL region of the substrate;
   a first supplementary electrode coupled to a portion of the anode;
   an insulating layer provided in regions other than the EL region;
   a second supplementary electrode on the insulating layer;
   an organic EL layer on the EL region;
   a cathode on the organic EL layer; and
   a plurality of pads on the substrate at a location adjacent an outermost one of the anodes, wherein:
      the anode includes at least indium tin oxide (ITO), and the first supplementary electrode includes at least Ag,
      the insulating layer includes a first projection part and a second projection part, the first projection part projecting between adjacent ones of the pads, and the second projection part being at a corner area of the EL region and extending from a first side of the EL region toward an interior area of the EL region and extending from a second side of the EL region toward the interior area of the EL region, and
      the second supplementary electrode includes a first supplementary projection part and a second supplementary projection part, the first supplementary projection part being on the first projection part of the insulating layer, and the second supplementary projection part being on the second projection part of the insulating layer at the corner area of the EL region.

2. The organic EL display of claim 1, wherein a lower surface of the first supplementary electrode is coupled to an upper surface of the anode.

3. The organic EL display of claim 1, wherein the first supplementary electrode has resistance lower than that of the anode.

4. An organic EL display comprising:
   a substrate having an EL region;
   a first electrode on the EL region of the substrate;
   an insulating layer provided in regions other than the EL region;
   an organic EL layer on the EL region;
   a second electrode on the organic EL layer;
   a plurality of pads on the substrate at a location adjacent the first electrode;

a first supplementary electrode coupled to an end portion of the first electrode or the second electrode; and
a second supplementary electrode on the insulating layer, wherein:
one of the first electrode or the second electrode includes at least indium tin oxide (ITO), and the first supplementary electrode includes at least Ag,
the insulating layer includes a first projection part and a second projection part, the first projection part projecting between adjacent ones of the pads, and the second projection part being at a corner area of the EL region and extending from a first side of the EL region toward an interior area of the EL region and extending from a second side of the EL region toward the interior area of the EL region, and
the second supplementary electrode includes a first supplementary projection part and a second supplementary projection part, the first supplementary projection part being on the first projection part of the insulating layer, and the second supplementary projection part being on the second projection part of the insulating layer at the corner area of the EL region.

5. An organic EL display comprising:
a substrate having an EL region;
a first electrode on the EL region of the substrate;
a first supplementary electrode coupled to a portion of the first electrode;
an insulating layer at regions of the substrate other than the EL region;
an organic EL layer on the EL region;
a second electrode on the organic EL layer;
a plurality of pads on the substrate at a location adjacent the first electrode; and
a second supplementary electrode coupled to a portion of the second electrode, wherein:
the first electrode includes at least indium tin oxide (ITO), and the first supplementary electrode includes at least Ag,
the insulating layer includes a first projection part and a second projection part, the first projection part projecting between adjacent ones of the pads, and the second projection part being at a corner area of the EL region and extending from a first side of the EL region toward an interior area of the EL region and extending from a second side of the EL region toward the interior area of the EL region, and
the second supplementary electrode includes a first supplementary projection part and a second supplementary projection part, the first supplementary projection part being on the first projection part of the insulating layer, and the second supplementary projection part being on the second projection part of the insulating layer at the corner area of the EL region.

6. The organic EL display of claim 5, wherein one of the first or second electrode is a cathode and the other one of the first or second electrode is an anode, and wherein the cathode includes at least Ag.

7. The organic EL display of claim 6, wherein an insulating barrier is provided between adjacent light emitting elements.

8. The organic EL display of claim 6, wherein a protection layer is provided over the cathode.

9. The organic EL display of claim 8, wherein the organic EL display is encapsulated.

10. The organic EL display of claim 5, wherein the first supplementary electrode has a smaller dimension than the first electrode.

* * * * *